United States Patent [19]

Spector

[11] Patent Number: 4,481,661

[45] Date of Patent: Nov. 6, 1984

[54] EFFECTS BOX SYSTEM AND METHOD

[76] Inventor: Abner Spector, 250 174th St. #1904, Miami Beach, Fla. 33160

[21] Appl. No.: 420,846

[22] Filed: Sep. 21, 1982

Related U.S. Application Data

[63] Continuation-in-part of Ser. No. 150,813, May 19, 1980, Pat. No. 4,388,490.

[51] Int. Cl.³ .............................................. H04R 3/12
[52] U.S. Cl. .................................... 381/61; 361/391; 361/394; 381/85; 381/123
[58] Field of Search ..................... 179/1 PC, 1 D, 1 B, 179/1 SW, 91 R, 98; 339/17 B, 17 M; 361/337, 390, 391, 393, 394, 399, 412, 415, 339, 361, 395; 84/1.24, DIG. 17, DIG. 29; 381/11, 61, 62, 85, 101, 102, 118, 123

[56] References Cited

U.S. PATENT DOCUMENTS

| | | | |
|---|---|---|---|
| 3,270,253 | 8/1966 | Binder et al. | 361/391 |
| 3,482,147 | 12/1969 | Kersten | 361/390 |
| 3,767,974 | 10/1973 | Donovan, Jr. et al. | 361/415 |
| 3,842,212 | 10/1974 | Miller | 179/91 R |
| 3,858,091 | 12/1974 | Wilkinson | 361/390 |
| 4,115,665 | 9/1978 | Giacoppo et al. | 179/1 PC |
| 4,251,853 | 2/1981 | Sites | 361/394 |

Primary Examiner—Gene Z. Rubinson
Assistant Examiner—Randall P. Myers
Attorney, Agent, or Firm—David J. Harshman

[57] ABSTRACT

A method and a system of organizing, arranging and rearranging, the number and sequential order of audio effects circuit modules, by the changing, including inserting, removing, exchanging and interchanging, of said modules, providing noiseless, uninterrupted signal flow through a system during each of said changing operations. A preferred embodiment of the method comprises an audio signal processing system which includes a main housing, containing a main circuit apparatus, module-receiving recesses, and modules, fabricated to be received in the recesses, each module having an electronic circuit which affects the signal in a unique way to provide a different sound output. A plurality of switches and potentiometers lie on the main housing, and each module has markings indicating which controls on the main housing are to serve its operation. In order to avoid the generation of spurious signals into the main signal path during the changing of a module, and to maintain the uninterrupted flow of the main signal path through the system, switching means are connected such that the main signal path is noiselessly routed: passing either into and out of a recess when a module is fully seated therein, or passing by the recess to the next recess. The modules are inserted and removed producing the quiet appearance and disappearance of the effect of the module. Panel-mounted switches and foot switches are provided to command bypass of any or all recesses even though said modules are fully seated.

8 Claims, 36 Drawing Figures

FIG. 20 PRIOR ART "FUZZ" MODULE

Fig. 21 PRIOR ART  SWEPT AUDIO FILTER

FIG. 22 PRIOR ART — TREMOLO MODULE

FIG. 23 PRIOR ART — NOISE GATE MODULE

EFFECTS BOX SYSTEM AND METHOD

RELATED APPLICATIONS

The present application is a continuation-in-part of copending U.S. application Ser. No. 150,813, filed May 19, 1980 now U.S. Pat. No. 4,388,490.

BACKGROUND OF THE INVENTION

Electronic signal processing circuitry has become important in the field of audio electronics in the modification of audio signals or the production thereof. A wide variety of audio effect circuit designs have been developed and are constantly being developed to deliver new and interesting sounds in live performances, recorded performances, or in the modification of recorded performances.

These circuits are considered components and often appear on the market in modular form, equipped to be electrically connected into an audio system. When several modules are used at the same time they become difficult to handle in that cords or cables must be reckoned with. A musician using these during a live performance is usually confined to the number of modules and their sequence that was established in the audio line at the beginning of his program. Flexibility is at a minimum.

Some systems have the functions of several modules incorporated into them, and, in some cases, a switching arrangement allows complete sequencing flexibility; but with more than a few modules, the switching becomes too complex. Thus, many operators of these systems add to their system a desired number of the modular components, and their system becomes a combination of the two methods.

The system and method for which a patent is herein applied is based on a new and different concept with respect to sequencing or changing of modules.

SUMMARY OF THE INVENTION

The invention comprises a method of organizing, arranging and rearranging, the number and sequential order of modularlyaudio effects, i.e., audio effects circuit modules, by the changing, including inserting, removing, exchanging and interchanging, of said functions, providing noiseless, uninterrupted signal flow through a system during each of said changing operations.

A basic embodiment of the method, disclosed in the aforesaid patent application, comprises an audio signal processing system which includes a main housing containing a main circuit apparatus, module receiving recesses, and modules containing any of a wide variety of signal processing circuits, said modules being received in said recesses, so that each module can affect the incoming audio signal in a unique way to provide a different sound output.

A large number of modules can be easily changed and resequenced, without visual alignment and from arm's-length, particularly by a performer during a performance, without disturbing the continuity of the audio signal being delivered in the performance, or introducing spurious signals into the performance.

Controls for the module circuit, consisting of switches and potentiometers, are positioned on the main housing immediately adjacent to and surrounding, at least partially, said recess. Each module has markings identifying its audio effect circuitry and indicating which controls on the main housing control its operation.

The modules can be shaped in the form of an unopened deck of playing cards, of light-weight, break-resistant plastic, devoid of protuberances, devoid of their own otherwise necessary controls, and as such, be of a minimal cost, compactly storable and portable—as opposed to conventional modules, where housings are normally of heavy gauge metal, containing their own power supply, their own controls, their own input and output jacks, and once linked to a system, cannot be relinked in a different sequential order with the ease and facility provided by the invention herein, especially during a live musical, or otherwise, performance.

The basic embodiment has electromechanical switches associated with each module recess for connecting input and output signals destined for the module to the associated recess contact elements only when the module is fully-seated, wherein the module is farther into a recess than the point at which module contact elements and recess contact elements are completely mated; said switches, when the module is not in said fully-seated position, connecting said prospective input and output lines together, electrically passing by said recess.

While this eliminates the noise that would be generated by mating contact elements, the metal contacts in the electromechanical switches do make and break the signal path, providing some practical system limitations.

Signal path lines must be shielded and protected from magnetic fields, electric fields, and ground loops. The inclusion of electromechanical switches produces design problems in direct proportion to the number of switches included. Quality control and reliability problems are created in that metal contacts can become noisy after use, even though the switch is still otherwise operable.

Electromechanical switches with metal contacts are certainly the most economical and available way for the operator to control the operation of the system and there is need to use more of them to provide the system with more control modes.

A major object of an advanced embodiment of this invention is to utilize only electronic switches in the signal path. Operator-controlled, electromechanical switches are used to control the electronic switches, which in turn electronically open and close the signal path.

An electronic switch is here considered to comprise at least one, three terminal, semiconductor device. The presence of a prescribed voltage at the device control terminal causes a very low impedance between the device input and output terminals; the absence of said voltage causes a very high impedance between the input and output terminals. The equivalent result, of the use of one such semiconductor device, is a voltage controlled, single pole, single throw switch. To make multiple pole, multiple throw, electronic switches, more semiconductor devices and additional electronic circuitry are used. As long as there is just one control voltage into the assembly, it is here considered an electronic switch in the singular.

There are three major advantages to the use of the electronic switch in this application. First is the repeatability of the switching action. When the opening and closing of the switch is plotted as a function of time, in the time domain of milliseconds, the electronic switch performs with repeatability and the rate of change of state is a routine design matter. Details such as break-before-make can be predicted and utilized in a cost effective circuit design. With the metal contact, electro-mechanical switch, the opening and closing of the switch, in the time domain of milliseconds, is drastically variable, both for multiple trials of one specimen and between specimens.

The second major advantage of the electronic switch is reliability in operation. In the signal path, an electro-mechanical switch would be considered a failure when it became noisy when operated, due to excessive contact bounce and other phenomena. This can occur after use, or operator abuse, and generally does occur before otherwise catastrophic failure. The reliability of the electronic switch is not affected by use or abuse, and the failure rate can be approximately five percent per million hours of operation.

The third major advantage of the electronic switch is that the signal path can be isolated from transient noise on the control line by conventional, low-pass filtering. Thus, many, perhaps noisy, electromechanical switches can be used to generate the control signal while the signal path is electronically switched, noiselessly and repeatedly. This, in effect, greatly increases the reliability of the electromechanical switches that are used.

Another object of the advanced embodiment of this invention is to provide a panel-mounted toggle switch and an alternate-action foot switch for each module-receiving recess in the system main housing. The switches have effect only when a module is fully seated in the associated recess, and operate conjunctively as follows: when the panel switch is in the "operate" position, the module is allowed to operate normally, and operation of the foot switch has no effect; when the panel switch is in the "foot switch" position, successive depressions of the foot switch will cause the module to be successively bypassed or allowed to operate normally, by electronic means, just as surely as though the module were physically inserted into, and removed from, the recess. If the foot switch is not connected or is left in a bypass mode, the panel switch may be used alone to command bypass. This gives the operator a great deal of needed flexibility in operation as he does not have to physically insert and remove the module to add or delete the effect. His hands may be otherwise occupied, and the desired changes may be quite frequent.

Another object of the advanced embodiment of this invention is to provide a panel-mounted toggle switch and an alternate-action foot switch for the system. The switches have effect when at least one module is in the signal path, and operate conjunctively as follows: when the panel switch is in the "operate" position, there is no effect on the system, and operation of the foot switch has no effect on the system; when the panel switch is in the "foot switch" position, successive depressions of the foot switch will successively cause bypass or no effect on all modules otherwise in the signal path. If the foot switch is not connected or the foot switch is left in the bypass mode, the panel switch may be used alone to command bypass for all modules otherwise in the signal path. Clearly these switches would only be used in systems with more than one recess. If there were only one recess, the switches described earlier would provide identically the same function. These switches provide the operator with the opportunity to bypass all the modules in the system with only one switch depression.

The novel features of the invention are set forth with particularity in the appended claims. The invention will be best understood from the following description when read in conjunction with the accompanying drawings.

DETAILED DESCRIPTION OF THE PREFERRED EMBODIMENTS

Figures 1, 2, 3, 4, 5:
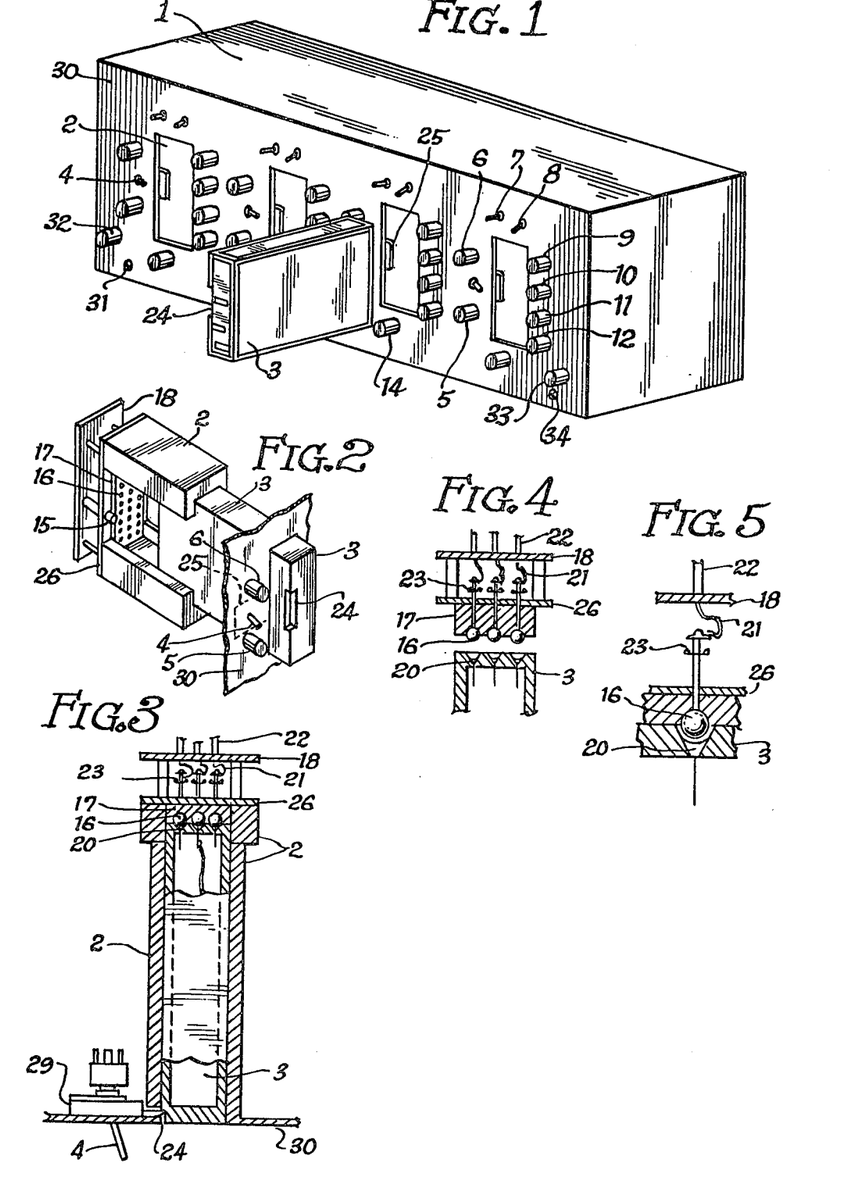
FIG. 1 is a perspective, and partially exploded, view of a basic signal processing system housing, constructed in accordance with the present invention.
FIG. 2 is a perspective view of part of the system of FIG. 1, showing a module thereof in a partially inserted position.
FIG. 3 is a section view of the apparatus of FIG. 2, shown with the module in fully seated position.
FIG. 4 is a section view of part of the apparatus of FIG. 3, with the module in a partially inserted position.
FIG. 5 is a section view of a portion of the apparatus of FIG. 4, shown with the module in a fully seated position.
Figures 6A, 6B:
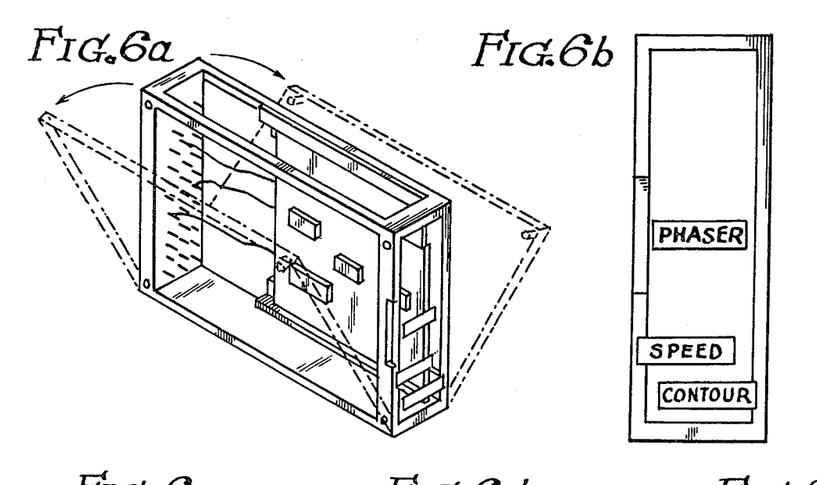
FIGS. 6a–6e show perspective and other views of a module of this invention.
Figure 6C:
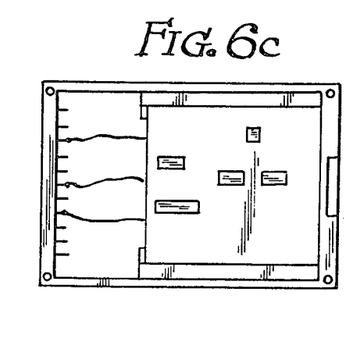
Figure 6D:
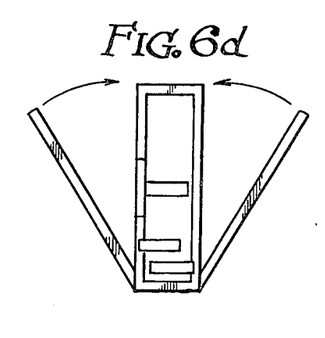
Figure 6E:
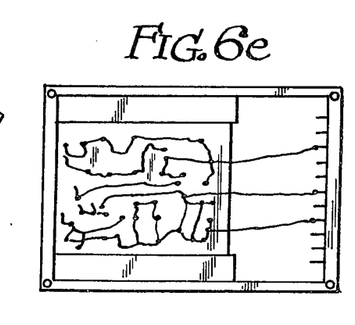

FIG. 1 illustrates a basic audio signal processing system of this invention which includes a main housing 1 having module-receiving recesses 2 designed to receive modules 3.

The module 3 has embedded in it a multiplicity of module contact elements 20, of FIGS. 2, 3, 4, 5 and 6, positioned to contact recess contact elements 16, upon installation of module 3 into recess 2. Modules can be constructed with any feasible size, shape and material, with contact elements of any correspondingly feasible size or shape placed in any end, edge or side of the module's housing. FIG. 6 illustrates assembly views of module 3, indicating removeable sides, placement of the circuit board and its circuit, circuit connecting to contact elements, and face markings as used herein.

A group of potentiometers and switches 5,6,7,9,10,11,12 are positioned on main housing 1 immediately adjacent to each recess 2, and have all of their respective terminals connected only to their respective preassigned recess contact elements 16. These controls are not a part of and have no effect upon said main circuit or system until a module 3 is fully seated in the recess 2. While a module 3 is so fully installed, these controls serve as the controls of module 3, controlling the operation of its circuit.

Markings on the face of each module 3, of FIG. 6, identify its particular function or sound effect, its particular circuit, and indicate which of said controls control the module's operation. When fully seated in a recess, said face of the module is flush with the control panel 30 of said main housing 1 and said markings contain arrows pointing to the controls on said control panel 30 to be used with respect to the module's circuit and its respective control functions.

A recess bypass switch 8, of FIG. 1, is provided at each recess such that a module, while fully seated, can be electrically passed by when said switch is manually operated.

FIGS. 2,3,4, and 5 illustrate the manner in which recess contact elements 16 are mounted and positioned and make contact with module contact elements 20. An elastomeric foam slab 17 is positioned on the front side of the far wall 26 of recess 2. As can be seen in greater detail in FIGS. 4, and 5, recess contact elements 16 are positioned and embedded, somewhat, in foam slab 17, so that their pins project through foam slab 17 and through their respective guide holes in far recess wall 26, retained there by retainers 23, connected via thin, flexible, insulated wires 21 to junction pins 22 which are molded into and project through recess terminal junction panel 18. It is at this panel 18 that said main circuit and said controls 5 through 12 are connected to recess contact elements 16. And in this manner recess contact elements 16 have individual compressive sliding action through said guide holes.

FIG. 4 further shows recess contact elements 16 before corresponding contact is made with module contact elements 20. FIGS. 5 and 3 show recess contact elements 16 in their compressed full contact with module contact elements 20 when module 3 is in a fully seated position.

The main signal path flow routing through the system is a basic series circuit, taking said main signal into and out of a recess 2, and its module 3, and so on, in series, except that: when a said recess 2 is devoid of a module 3, then said recess 2, with respect to said main signal, is in a bypass state; and, when a module 3 is in a said recess 2 in any position other than fully seated, said recess 2 can also be in a bypass state.

Said input audio signal is accepted at input jack 31. It goes to an input attenuator or potentiometer 32, and then to a conventional buffer-amplifier. The output of said buffer-amplifier goes first to the lowest-ordered recess 2, or passes by it, and so on through or by each recess to an output attenuator 33, and then to output jack 34, delivering said modified signal, or an unmodified signal if there is no fully-seated module in the system.

Figure 7A:
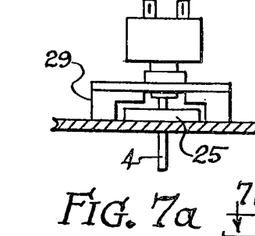
FIGS. 7a–7i show a multi-view of a latch-coupled switch, said latch, and a u-bracket, all associated with one recess of the system housing of FIG. 1.
Figure 7B:
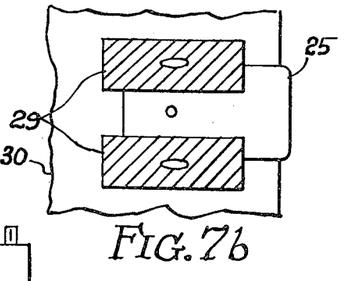
Figure 7C:
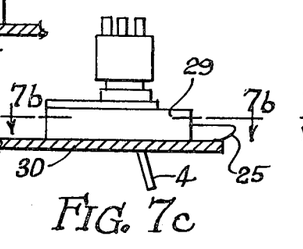
Figure 7D:
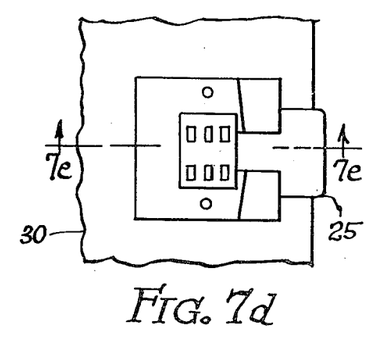
Figure 7E:
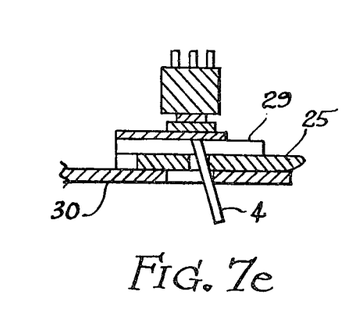
Figure 7F:
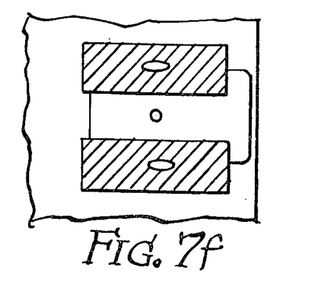
Figure 7G:
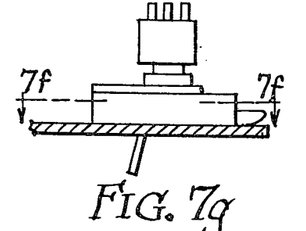
Figure 7H:
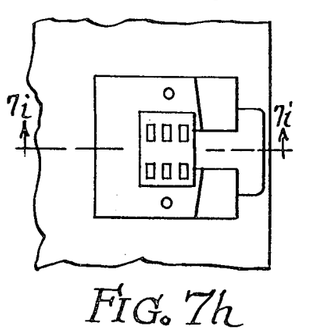
Figure 7I:
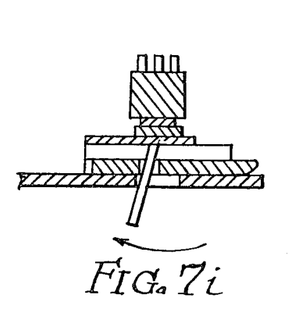

FIGS. 7a to 7i: illustrates the means for the locking-in of a fully-seated module 3 in a recess 2; and for the unlocking, freeing, of module 3 from recess 2. As can be seen, latch 25 encircles the handle of a spring-loaded toggle switch 4 and is held slidably captive by u-bracket 29 against the inner surface of control panel 30; and switch 4 is attached to u-bracket 29 so that handle of switch 4 projects through the coupling hole of latch 25 and through control panel 30 making said handle accessible for manual actuation. In their simultaneous normal positions, of FIGS. 7b, c, d, e, said handle of switch 4 rests laterally against the side of the hole in control panel 30, and the quarter-rounded end of latch 25 projects slightly into recess 2. FIGS. 7f, g, h, i show the simultaneous momentary positions of switch 4 and latch 25.

A slight insertion of a module 3 into recess 2 brings latch 25 and handle of switch 4 to their momentary positions. When module 3 reaches its fully-seated position in recess 2, said latch 25, under the internal spring force of switch 4, via said handle of switch 4, springs back to its normal position, into locking-notch 24 of module 3, FIGS. 1,2,3, and 6, holding said module 3 in said fully-seated position in recess 2.

A lateral fingertip manipulation of said handle of switch 4 brings said handle of switch 4 and latch 25 to their momentary positions, allowing said module 3 to be partially expelled by the spring forces of a spring-loaded push button switch 15, of FIG. 2, on recess wall 26, and said foam slab 17.

Figure 8:
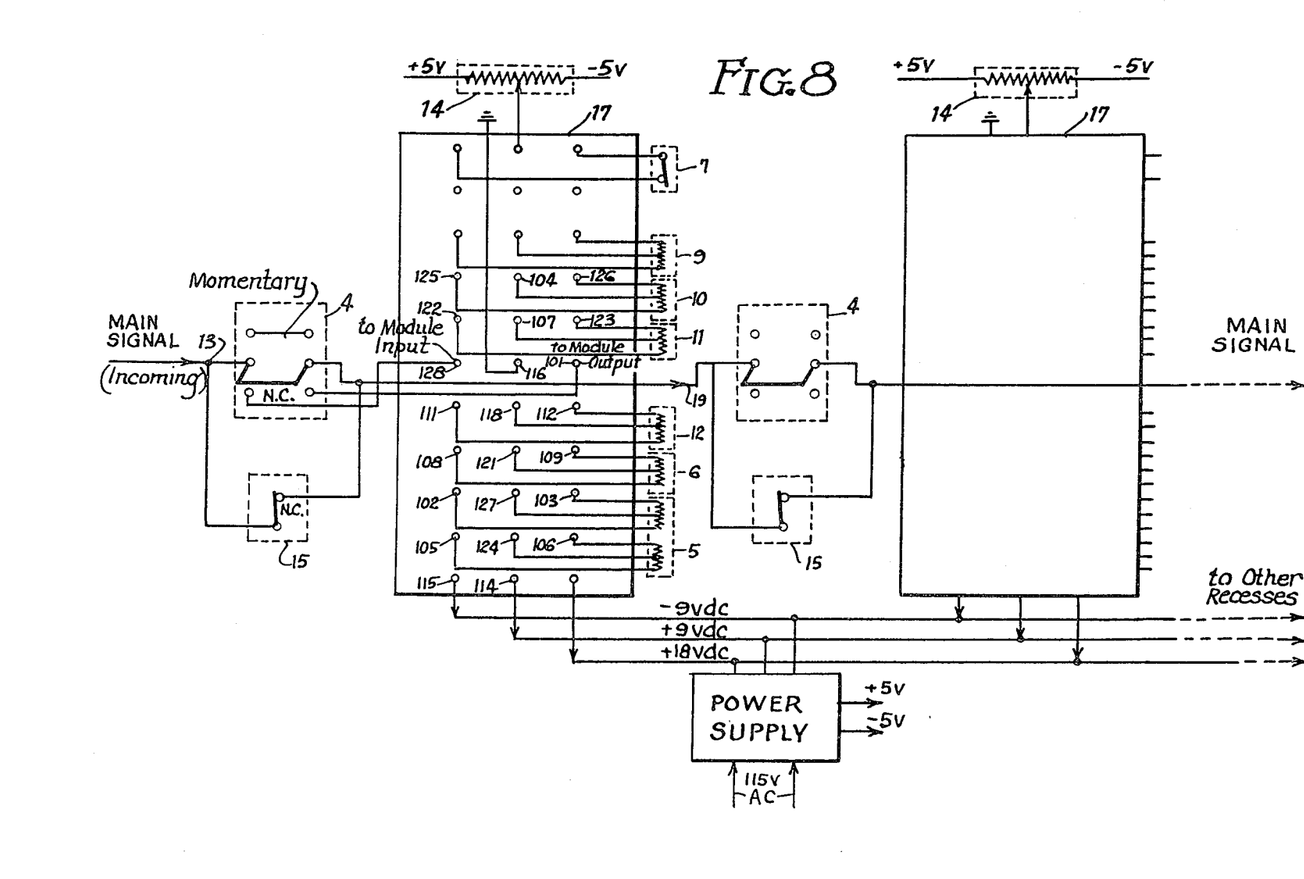
FIG. 8 is a partial electrical schematic of the apparatus associated with one recess of the system housing of FIG. 1.

FIG. 8 illustrates the flow of said main signal with respect to a typical recess 2 and its associated electrical connections. Switch 4 is a double pole, double throw, spring-loaded toggle switch. Switch 15 is a single pole, single throw, spring-loaded push-button switch whose normal position is closed.

When a recess 2 is empty, both of said switches 4,15 are in their respective normal positions, and, as such, switch 15, via switch 4 has recess 2 in a bypass state. Input and output lines destined for the module are connected to the associated recess contact elements 16 of recess 2 and are shorted together.

A slight insertion of a module 3 into a recess 2, displaces latch 25 which simultaneously displaces switch 4 to its momentary position disconnecting input and output lines from said recess contact elements and shorting the lines together. Switch 15 is still in its bypass state.

Upon further insertion, to a predetermined depth of insertion, module 3 engages push-bottom switch 15, displacing to its momentary position switch 15, opening its contacts allowing switch 4 to function in its momentary, state. Both the input and output lines, though now connected together, are each, respectively, disconnected from recess 2, and its contact elements 16.

A slight but fuller insertion of module 3 brings the initial meeting, the first physical, but not necessarily precisely simultaneous, contact between all respective and corresponding module contact elements 20 and recess contact elements 16. This is a critical point at which spurious signals might be generated into the said main signal path were it not for the fact that switch 4 is in its previously described state.

At a fuller depth of insertion, and after solid physical and electronic contact has been established between all said contact elements, the fully-seated position of module 3 is reached, at which point, as earlier described, latch 25 springs into locking notch 24, as simultaneously switch 4 changes to its normal position, allowing said main signal to flow into and out of recess 2 and its locked-in and operating module 3.

Noting the now fully compressed states of switch 15 and foam slab 17, it can be seen how: foam slab 17 maintains the integrity of contact between module and recess contact elements; and foam slab 17 and switch 15 conjunctively stabilize module 3 in its locked-in position in recess 2, via their respective compressive forces.

The removal of module 3 from recess 2, in the manner earlier described, provides an exact reverse of the sequence of events just described, including the said partial expulsion of module 3 from recess 2, via said compressive forces.

Potentiometer 14, FIGS. 1 and 8, positioned on control panel 30, functions as a bias control to those of modules 3 whose circuitry design is such that they require variable bias control.

Included in said main circuit apparatus, is a conventional, sectioned and filtered, a.c. to d.c. power supply, feeding the various d.c. potentials to all components as required.

Through switch 4 and switch 15 are shown as conjunctively acting spring-loaded momentary switches, this is not necessarily required to realize the benefits of the present invention. It can readily be seen that with the circuitry of switch 15 either permanently open, and toggle switch 4 being a totally manually operated switch, without momentary biased springs, that the noiseless insertion could be accomplished by an operator manually operating toggle switch 4. In other words, the modules could be inserted into and removed from the recess and the audio signal path without introducing spurious signals into the audio signal path, while maintaining continuity of the audio signal path, if the operator always kept switch 4 in its bypass position until the module was fully inserted into the recess, and again placed switch 4 in its bypass position before removing the module from said recess.

Figures 9, 10:
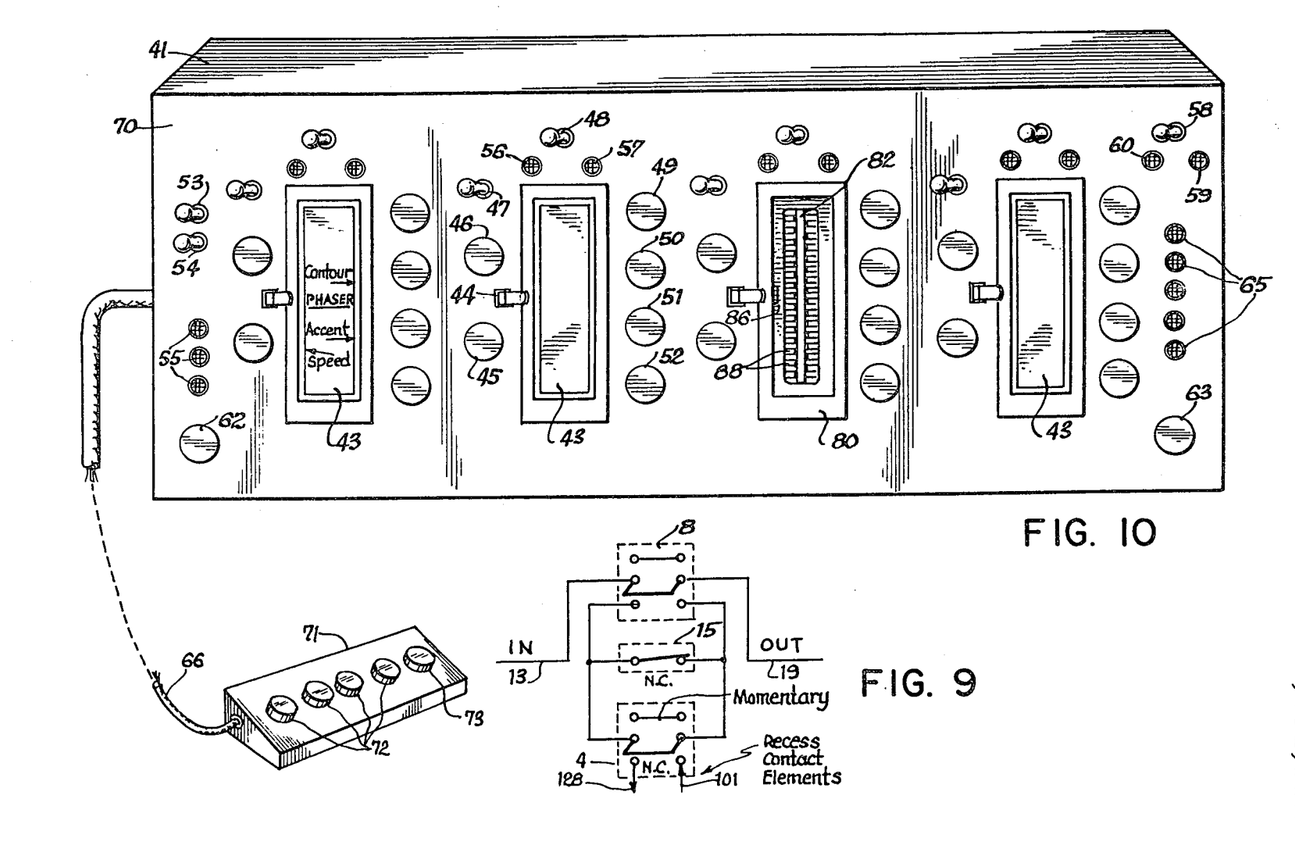
FIG. 9 is an electrical schematic showing, along with FIG. 8, how a module bypass switch is connected.
FIG. 10 is a perspective view of an advanced audio signal processing system, constructed in accordance with the present invention.

FIG. 9, in conjunction with FIG. 8, illustrates how switch 8 is connected to enable the operator to pass by a module even though it is fully seated. When switch 8 allows the connection of input 13 to recess contact element 16-128 and thus to the module input, and allows the connection of output 19 to recess contact element 16-101 and thus to the module output, the module is active as though switch 8 were not present. However when switch 8 connects input 13 to output 19, the module is passed by.

FIG. 10 illustrates an advanced audio signal processing system of this invention which includes a main housing 41 having module-receiving recess frames 80 designed to receive modules 43. The recess next to the recess on the right is shown empty, while the other recesses are shown containing modules, with the module on the left showing typical markings. The system also comprises a multiple foot switch unit 71 which is electrically connected to the main housing circuitry by multiconductor cable 66.

The input audio signal is accepted by an input jack at the rear of the main housing. Input level is adjusted with potentiometer 62 and is indicated by the illumination pattern of light emitting diodes 55. Switch 54 provides the option of 180 degree phase reversal from input to output. Switch 53 provides the option of using an internal envelope follower or an externally-supplied, similar control signal. These controls and indicators are existing art and well known in audio equipment.

Potentiometers 45, 46, 50, 51, 52, and switch 47 are positioned on the control panel 70 of main housing 41 immediately adjacent to each recess frame 80, and have all of their respective terminals connected only to their respective preassigned recess contact elements 88. These controls are not a part of, and have no effect upon, said main circuit or system until a module 43 is operating in the signal path. While a module 43 is so operating, these controls serve as the controls of module 43, controlling the operation of its circuit.

Potentiometer 49 adjacent to each recess frame 80 is a level control in the signal path immediately following the potentiometer's associated module. It is only operative when the module is operative.

Latch-coupled switch 44, adjacent to each recess frame 80, and latch 86 lock a module in its fully-seated position and provide the means for the operator to eject the module.

The operation of the module bypass switch 48, adjacent to each recess frame 80, and its associated foot switch 72, has been described above. The operation of the system bypass switch 58 and its associated foot switch 73 has also been described above.

Light emitting diode 57 adjacent to each recess frame 80 glows with a green light when the associated module is operating in the signal path. When there is no fully-seated module in the associated recess frame, or when a fully-seated module is bypassed by any of the switches, the light emitting diode 57 is dark and the light emitting diode 56 glows with a red light.

Light emitting diode 59 glows with a green light when the system bypass switch 58 and its associated foot switch 73 are not commanding system bypass. When the switches do command a system bypass, light emitting diode 59 is dark and light emitting diode 60 glows with a red light.

Output level is adjusted with potentiometer 63 and is indicated by the illumination pattern of light emitting diodes 65. The output audio signal is present at an output jack at the rear of the main housing.

Figure 11:
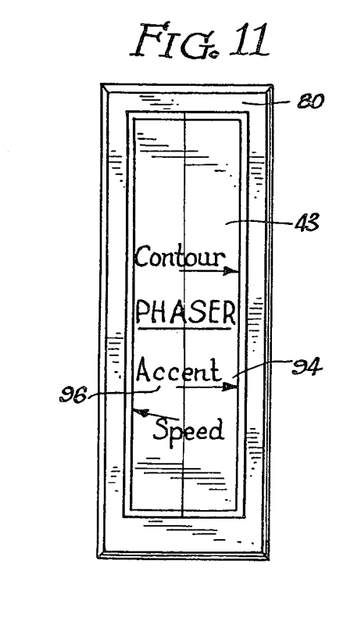
FIG. 11 is a front elevation view of a fully-seated module and a recess frame of the system of FIG. 10.

FIG. 11 shows a front view of a module 43 fully seated in a recess frame 80. The module face is flush with the recess frame. Markings 96 on the face of the module identify the function or name of the circuit and identify control functions with arrows 94 pointing toward the appropriate controls on the control panel 70 of main housing 41. In this case "Phaser" is the name of the circuit. "Contour" has an arrow pointing toward potentiometer 50, "Accent" has an arrow pointing toward potentiometer 51, and "Speed" has an arrow pointing toward potentiometer 45.

FIGS. 12, 13, 14, 15, and 16 show the structure at each recess of the main housing 41. The recess frame 80, the contact element holder 82, and the module 43 are repeated at each recess. The printed circuit mother board 84 extends essentially the full width of the main housing and electronic components with their inteconnections are mounted there. The control panel 70 also extends the full width of the main housing and mounts the controls as described above. The contact element holder 82 is bolted to the printed circuit mother board 84, and the recess frame 80 is bolted to the contact element holder at its rear end and hooked into the control panel at its front end.

Figure 12:
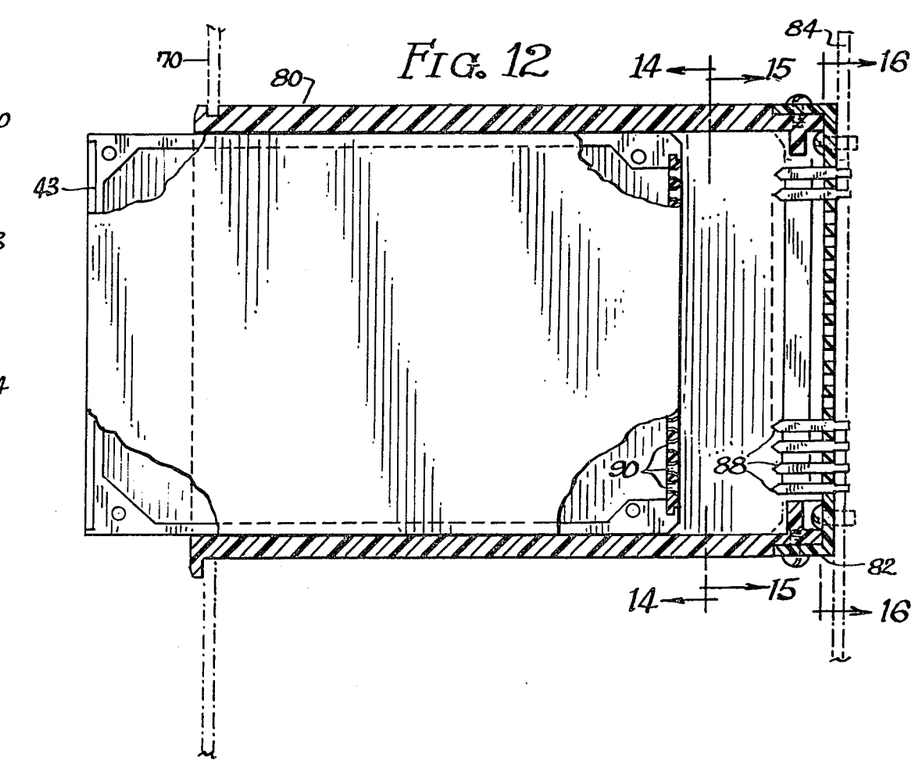
FIG. 12 is a side elevation view, partly in section, of a partially-inserted module and a recess frame of the system of FIG. 10.

FIG. 12 shows the pointed ends of recess contact elements 88 and how they contact the eyelet-shaped module contact elements 90.

Figure 13:
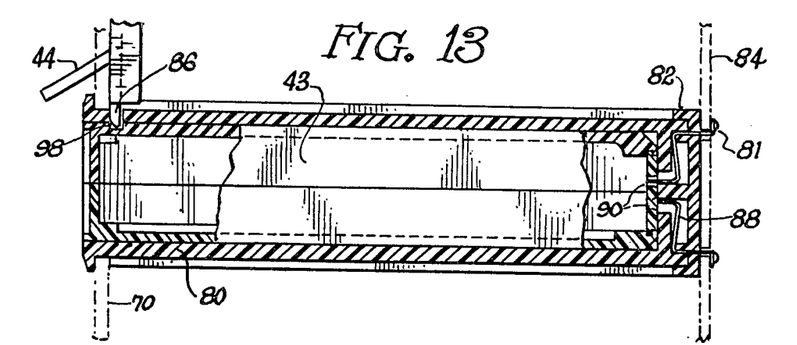
FIG. 13 is a top plan view, partly in section, of a fully-seated module and a recess frame of the system of FIG. 10.

FIG. 13 shows the three right angle bends in the recess contact elements 88. The contact elements before bending are approximately 4 cm. long, 0.3 cm. wide, and 0.08 cm. thick.

The material is high-strength beryllium copper or phosphor bronze, appropriately plated. The pointed end and approximately 0.8 cm. of length are perpendicular to the rear face of the module. The first right angle bend sends the element parallel with the rear face of the module for approximately 0.8 cm. It is this length that can bend, allowing travel of the module after first contact of module contact elements 90 and recess contact elements 88 and before the module is fully seated and latched into the recess frame. The bending of all recess contact elements also provides a spring force to partially expel the module when latch-coupled switch 44 is operated for that purpose. After a second bend the recess contact element passes through a slot (92 of FIG. 16) in the contact element holder and through the printed circuit mother board. After passing through the mother board the third bend takes the recess contact element parallel to the mother board where it is soldered 81 to a metallic connecting trace on the mother board.

FIG. 13 also shows the latch-coupled switch 44, and latch 86 in the module notch 98, locking in the module. Latch-coupled switch 44 and latch 86 operate mechanically in the same fashion as switch 4 and latch 25 as described in connection with FIG. 7.

Figure 14:
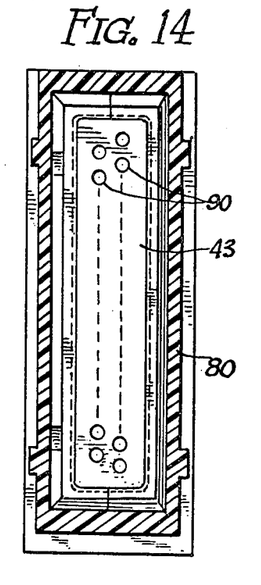
FIG. 14 is a section view taken approximately along line 14—14 of FIG. 12.

FIG. 14 essentially shows the back view of a partially-inserted module seen from the rear of the recess frame. Module contact elements 90 are shown as eyelets. Inside the module, jumper wires are soldered to the eyelets at one end and to the module printed circuit board at the other.

Figure 15:
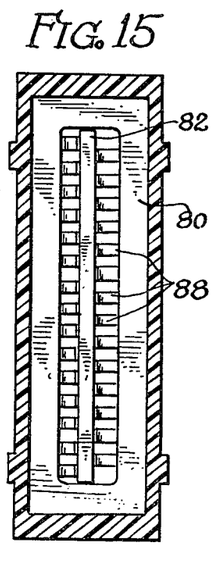
FIG. 15 is a section view taken approximately along line 15—15 of FIG. 12.
Figure 16:
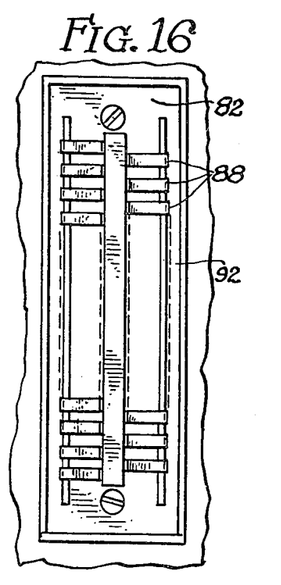
FIG. 16 is a section view taken approximately along line 16—16 of FIG. 12.

FIG. 15 essentially shows the front view of an empty recess. FIG. 16 essentially shows the front view of an empty recess with recess frame 80 removed. The contact element holder 82 is shown holding the recess contact elements 88.

Figure 17:
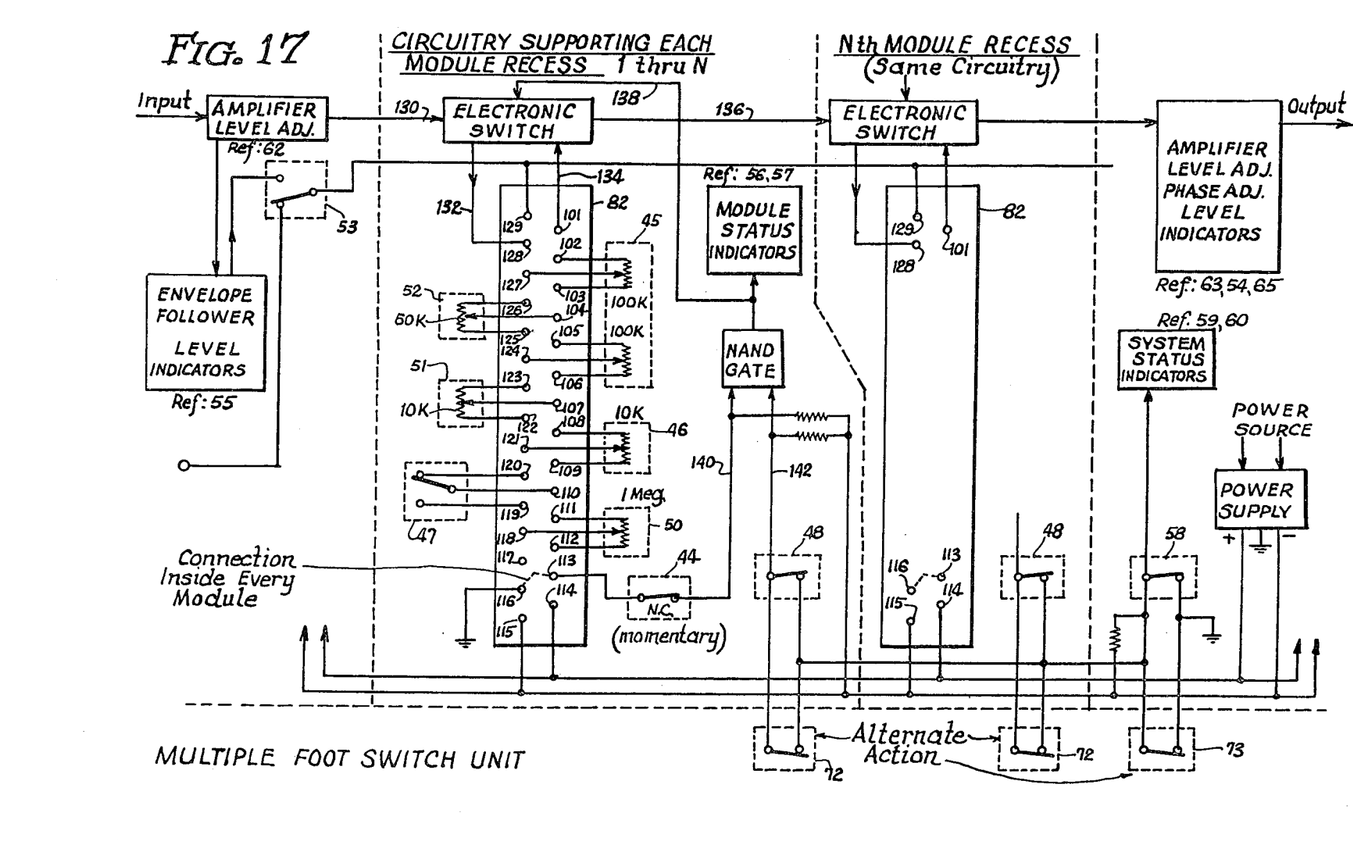
FIG. 17 is an electrical block diagram, partly schematic, of the system of FIG. 10.

FIG. 17 shows an electrical block diagram, partly schematic, of the advanced audio signal processing system of FIG. 10. Conventional circuitry is shown in functional blocks while novel circuitry is shown in schematic form. Recess contact elements, all denominated as 88 in mechanical drawings above, are here given suffix numbers to enable the description of their various electrical connections. For convenience, the logical "0" will be considered as the presence of a voltage $-E$ and the logical "1" as the essential absence of any voltage, or ground level.

When the voltage $-E$ appears at the control input 138 of the electronic switch, the input to the electronic switch 130 is essentially connected to line 132 and the input of a module at contact element 128. The output of the electronic switch 136 is essentially connected to line 134 and the output of said module at contact element 101. Thus the main signal path proceeds through the module and the module is operative. When ground level voltage appears at the control input 138 of the electronic switch, the input to the electronic switch 130 is essentially connected to the output of the electronic switch 136, and the main signal path proceeds directly through the electronic switch past the recess without regard to a module that could be fully seated in the recess.

To obtain voltage $-E$ at 138, ground levels must be present at both 140 and 142, the inputs to the NAND gate. As can be seen, obtaining ground level at 140 requires that latch-coupled switch 44 be closed. The switch is closed when a module is fully seated in the recess and when the recess is fully empty. Obtaining a ground level at 140 also requires that a module be far enough into the recess for the jumper wire in the module to make a connection between contact elements 113 and 116. Thus ground level at 140 is obtained when, and only when, a module is fully seated in the recess.

To obtain ground level at 142, either module bypass switch 48 or its associated foot switch 72 must be closed. In addition, either system bypass switch 58 or its associated foot switch 73 must be closed.

A conventional AC to DC power supply is shown supplying both positive and negative voltages to all modules at contact elements 114 and 115 and to the main housing circuitry. The voltage levels represent a design choice in relation to the electronic components selected.

An envelope follower produces a voltage proportional to signal level. The voltage is supplied to all modules at contact element 129. Modules use this voltage to modify various parameters as a function of signal level. The input level indicator circuits also use this voltage. Provision is made, with switch 53, for the modules to receive an externally supplied voltage as an alternative.

Figures 18A, 18B:
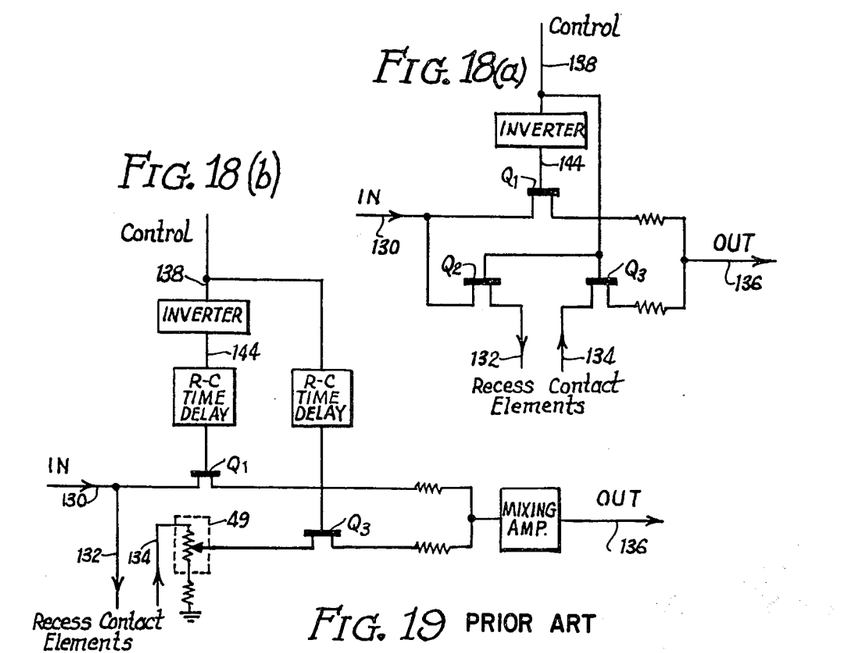
FIG. 18 is an electrical block diagram, partly schematic, of electronic switches included as blocks in FIG. 17.

FIG. 18(a) shows a simplified electronic switch for relation to the electronic switch in FIG. 17. When voltage $-E$ is present at 138 and at the gates of field effect transistors Q2 and Q3, the transistors are conductive from source to drain, and input 130 is effectively connected to 132, and output 136 is efectively connected to 134. Because voltage $-E$ is present at 138, ground level is present at 144 and the gate of Q1. Q1 is thus effectively open from source to drain. Conversely when ground level is present at 138, Q2 and Q3 are open, Q1 is conductive, and input 130 is effectively connected to output 136.

FIG. 18(b) shows a preferred electronic switch for use with FIG. 17. Q2 has been found to be unnecessary when mixing amplifiers with a low output impedance are used as shown. Thus the module input is directly connected to the signal path. Module output is connected to the signal path through the electronic switch at the same time the bypass is opened and vice versa. R-C time delays are used to tailor the break-before-make characteristic of the switch. A module level control potentiometer 49 adjusts system level at this point but only when the module is operative.

FIGS. 19 through 23 show existing art circuitry for use in the modules of either of the systems described above. The figures have recess contact element suffix numbers so they can be directly related to FIG. 8 and FIG. 17. There are many other existing circuits that can be used, and circuits yet to be designed may also be used.

Figure 19:
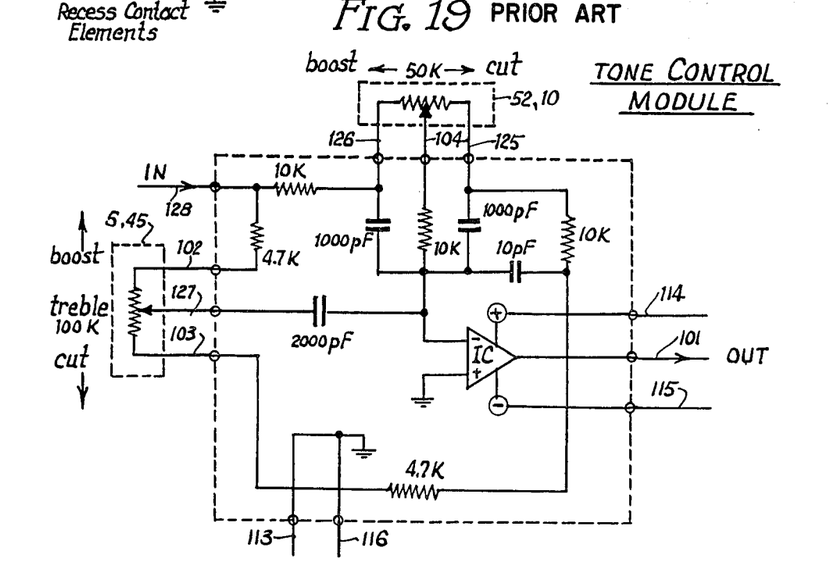
FIG. 19 is an electrical schematic of an existing art, tone control circuit for inclusion in modules of the system of FIG. 1, or modules of the system of FIG. 10.

FIG. 19 shows a tone control circuit that can raise and lower the level of both the upper and lower end of the audio spectrum. Power is supplied at 114, 115, and 116. All modules connect 113 and 116 together as described above, although this connection is not used in the basic system of FIG. 1. Potentiometer 52 and 45 control the boost and cut of treble and bass of this module. They are located on the control panels, 30 and 70, and shown in FIGS. 8 and 17. The triangle-shaped figure with "IC" inside represents an integrated circuit operational amplifier as supplied by multiple vendors. The design choice of exactly which amplifier to select relates to choice of power supply voltages and other design considerations.

Figure 20:
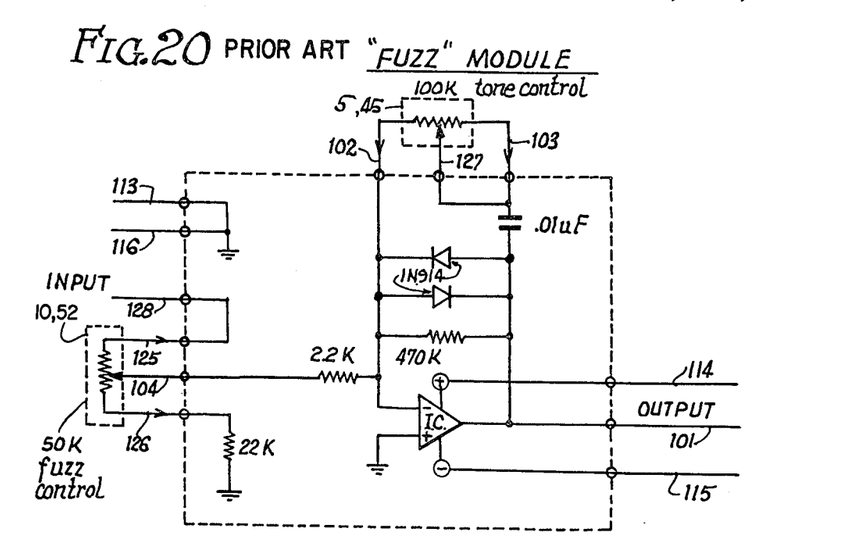
FIG. 20 is an electrical schematic of an existing art, "fuzz" circuit for inclusion in modules of the system of FIG. 1, or modules of the system of FIG. 10.

FIG. 20 shows a "fuzz" or controlled distortion circuit. The signal in the amplitude-versus-time domain is clipped, harmonics are created, and "sustain" is increased when processing a percussive signal such as that produced by a guitar.

Figure 21:
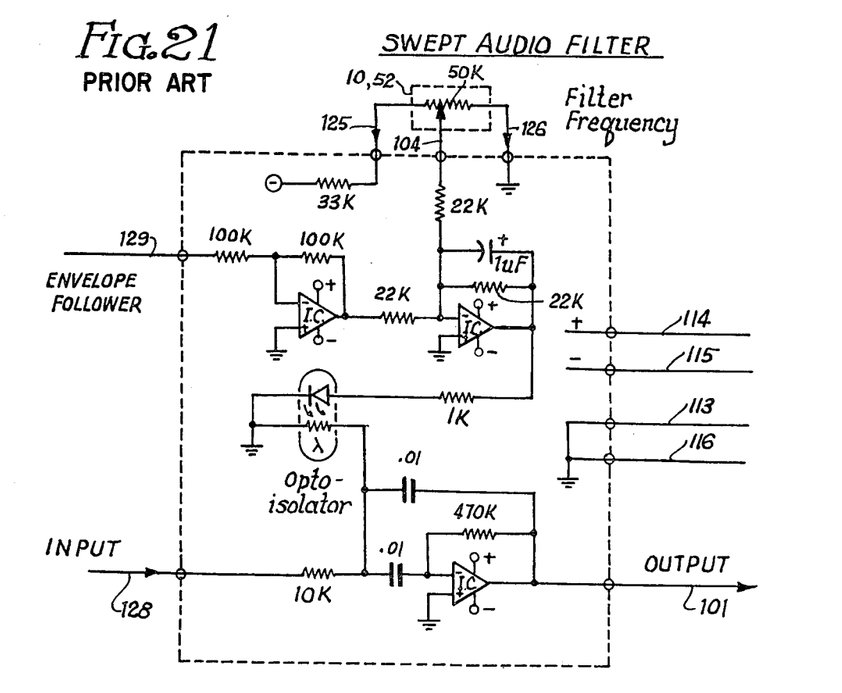
FIG. 21 is an electrical schematic of an existing art, swept audio filter circuit for inclusion in modules of the system of FIG. 1, or modules of the system of FIG. 10.

FIG. 21 shows a swept audio filter circuit. The resonant frequency of the filter varies depending on signal level as supplied by the envelope follower.

Figure 22:
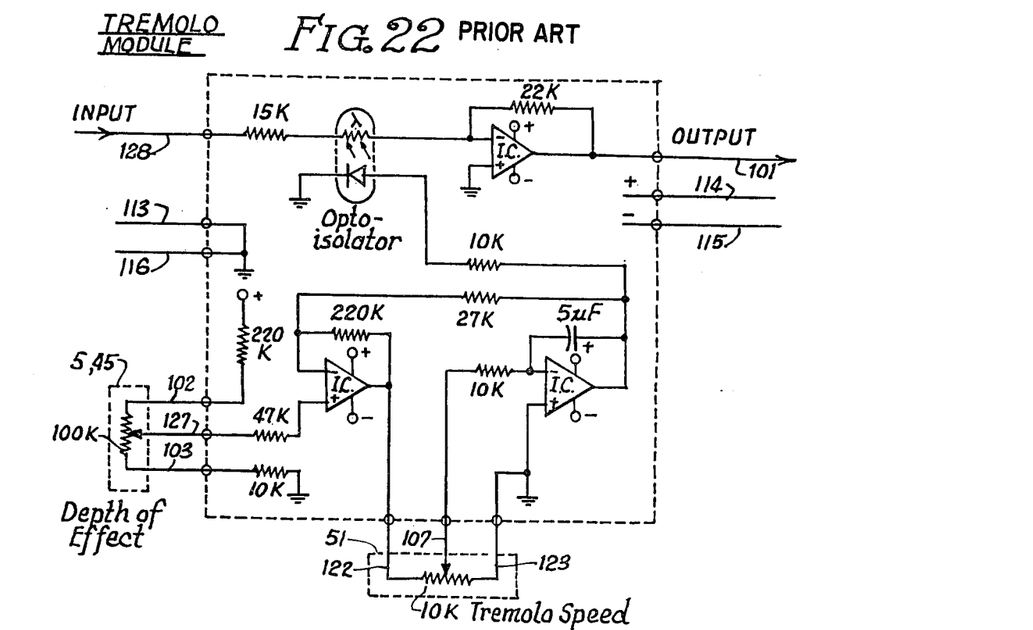
FIG. 22 is an electrical schematic of an existing art, tremolo circuit for inclusion in modules of the system of FIG. 1, or modules of the system of FIG. 10.

FIG. 22 shows a tremolo circuit. The gain through the circuit is varied linearly at an adjustable rate.

Figure 23:
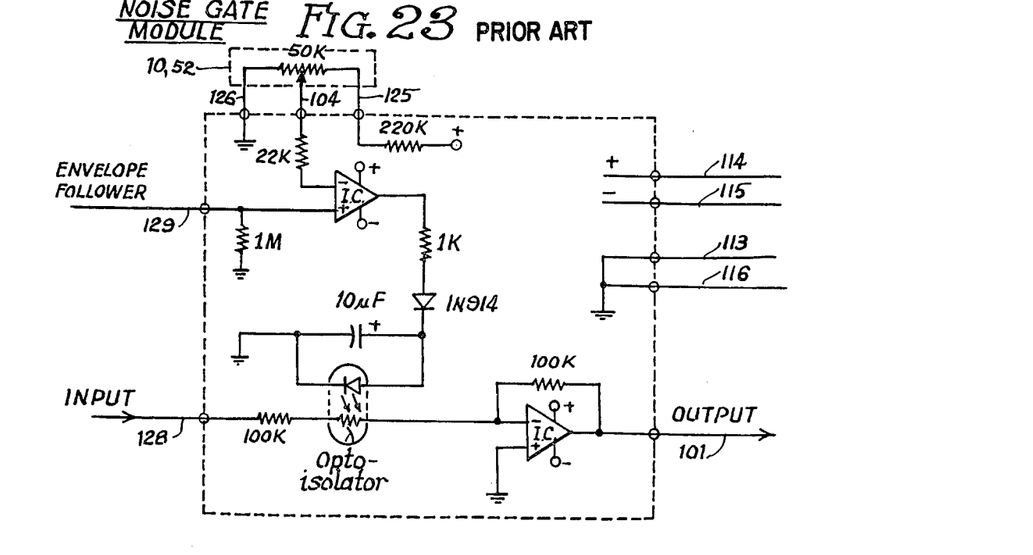
FIG. 23 is an electrical schematic of an existing art, noise gate circuit for inclusion in modules of the system of FIG. 1, or modules of the system of FIG. 10.

FIG. 23 shows a noise gate circuit. When the envelope follower voltage exceeds a threshold, the audio signal passes, otherwise not.

FIG. 1 and FIG. 10 illustrate four module-receiving recesses, but a unit can be constructed containing any feasible number of module-receiving recesses, with even a one-recess system having practical applications.

Although particular embodiments of the invention have been described and illustrated herein, it is recognized that modifications and variations may readily occur to those skilled in the art and consequently, it is intended that the claims be interpreted to cover such modifications and equivalents.

What I claim is:

1. An audio signal processing system for allowing the organizing, arranging and rearranging of the number and sequential order of audio effects circuit modules in a main audio path having a source audio signal, by the rapid changing, inserting, and removing of said modules while said system is in operation with the purposeful resultant of any of said module changing operations being an immediate and noiselessly accomplished change in the sound produced by the audio signal flowing through the audio path, while maintaining the continuity of the audio path, said system comprising:

a. a plurality of modules each having module contact elements which include a module input and a module output, each said module output providing audio effects for producing a different sound output;
    b. a main housing having a main input and a main output associated with the audio path, and having a plurality of ordered module receiving recesses being serially interconnected between said main input and main output, each said recess having corresponding contact elements for making contact with said module contact elements upon insertion of a module therein;
    c. means for routing the source audio signal from said main input through said recess contact elements and said corresponding module contact elements to said module input of a fully-seated module in a lowest ordered recess, thence, serially into and out of each recess having a module fully seated therein, said module output of a module in a highest ordered recess providing essentially the system output signal to the main output;
    d. an electronic switch associated with each recess for connecting the audio path to said recess contact elements so that the audio signal flows into and out of said recess through said inserted module only when said module is fully seated wherein solid electronic contact between said module contact elements and recess contact elements is established, and for connecting said audio path to a route bypassing at least one of said recess contact elements when the module is not in said fully-seated position in said recess;
    e. means associated with each said recess for detecting if said recess has a module fully seated therein; and
    f. means for actuating said electronic switch when said module is moved to or from said fully-seated position in said recess.

2. An electronic system according to claim 1 wherein said detecting means and actuating means collectively comprise:

a. a normally-closed spring loaded toggle switch mounted through a front panel of said main housing;
    b. a latch movably attached to a handle of said toggle switch, said latch projecting slightly into said recess when said toggle switch is in a normal position, so that insertion of said module into said recess moves said latch and actuates said toggle switch to a momentary position, and, alternatively, so that movement of said switch handle against the force of a spring inside said toggle switch actuates said switch to said momentary position;
    c. a locking notch in an outer edge of said module so that when said module is pushed into said fully-seated position said latch moves into said locking notch under the pressure of said spring inside said toggle switch, said latch holding the module securely, said toggle switch returning to said normal position; and
    d. a jumper wire carried in said module for connecting two recess contact elements of a recess together whenever a module is inserted into said recess far enough for said solid electronic contact between said recess contact elements and said module contact elements to be established; and
    e. electronic circuitry means, responsive to both said toggle switch being in said normal position and said jumper wire circuit being closed for commanding said electronic switch to route the audio signal into and out of said recess through said module, and otherwise commanding said electronic switch to route said audio signal around said recess.

3. An electronic system according to claim 1 further comprising an operator controlled recess bypass switch associated with said recess for routing the audio signal by said recess.

4. An electronic system according to claims 1 or 2 further comprising an operator controlled bypass foot switch for routing the audio signal by said recess.

5. An electronic system according to claims 1, 2, or 3 further comprising a system bypass switch for routing the audio signal by all said recesses all at once.

6. An electronic system according to claims 1, 2 or 3 further comprising a system bypass foot switch for routing the audio signal by all said recesses all at once.

7. A system according to claim 3, wherein said bypass switch comprises a single-pole double-throw switch.

8. A system according to claim 3, wherein said bypass switch comprise a double-pole double-throw switch.